US010133197B2

(12) United States Patent
Nakiboglu et al.

(10) Patent No.: US 10,133,197 B2
(45) Date of Patent: Nov. 20, 2018

(54) LITHOGRAPHIC APPARATUS AND DEVICE MANUFACTURING METHOD

(71) Applicant: ASML Netherlands B.V., Veldhoven (NL)

(72) Inventors: Günes Nakiboglu, Eindhoven (NL); Frank Johannes Jacobus Van Boxtel, Eindhoven (NL); Thomas Petrus Hendricus Warmerdam, Veldhoven (NL); Jan Steven Christiaan Westerlaken, Heesch (NL); Johannes Pieter Kroes, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/325,987

(22) PCT Filed: Jun. 8, 2015

(86) PCT No.: PCT/EP2015/062631
§ 371 (c)(1),
(2) Date: Jan. 12, 2017

(87) PCT Pub. No.: WO2016/008641
PCT Pub. Date: Jan. 21, 2016

(65) Prior Publication Data
US 2017/0160653 A1 Jun. 8, 2017

(30) Foreign Application Priority Data

Jul. 16, 2014 (EP) .................................... 14177236

(51) Int. Cl.
*G03B 27/42* (2006.01)
*G03F 7/20* (2006.01)

(52) U.S. Cl.
CPC ...... *G03F 7/70933* (2013.01); *G03F 7/70866* (2013.01)

(58) Field of Classification Search
CPC .. G03F 7/70933; G03F 7/70858; G03F 7/709; G03F 7/707; G03F 7/70733;
(Continued)

(56) References Cited

U.S. PATENT DOCUMENTS

2002/0191166 A1* 12/2002 Hasegawa ........... G03F 7/70358
355/53
2003/0169407 A1* 9/2003 Hasegawa ........... G03F 7/70883
355/30
(Continued)

FOREIGN PATENT DOCUMENTS

EP 0 844 532 5/1998
JP 2004-296829 A 10/2004
(Continued)

OTHER PUBLICATIONS

International Search Report and Written Opinion dated Sep. 7, 2015 in corresponding International Patent Application No. PCT/EP2015/062631.
(Continued)

*Primary Examiner* — Mesfin Asfaw
(74) *Attorney, Agent, or Firm* — Pillsbury Winthrop Shaw Pittman, LLP

(57) ABSTRACT

A lithographic apparatus including: a projection system with an optical axis; an enclosure with an ambient gas; and a physical component accommodated in the enclosure, wherein: the lithographic apparatus is configured to cause the physical component to undergo movement relative to the enclosure, in a predetermined direction and in a plane perpendicular to the optical axis; the lithographic apparatus is configured to let the physical component maintain a predetermined orientation with respect to the enclosure during the movement; the movement induces a flow of the ambient gas relative to the component; the physical component has a surface oriented perpendicularly to the optical axis; the component includes a flow direction system configured to direct the flow of ambient gas away from the surface.

20 Claims, 5 Drawing Sheets

(58) Field of Classification Search
CPC .... G03F 7/70775; G03F 7/20; G03F 7/70691;
G03F 7/708; G03F 1/64
See application file for complete search history.

(56) References Cited

U.S. PATENT DOCUMENTS

2011/0053061 A1* 3/2011 Shibazaki ........... G03F 7/70725
430/30
2013/0033692 A1 2/2013 Bessems et al.

FOREIGN PATENT DOCUMENTS

| | | |
|---|---|---|
| JP | 2010-021549 | 1/2010 |
| JP | 2010-021549 A | 1/2010 |
| JP | 2012-209401 A | 10/2012 |
| JP | 2014-165342 A | 9/2014 |
| TW | 201312288 | 3/2013 |
| WO | 2005/083758 | 9/2005 |

OTHER PUBLICATIONS

First Office Action cited in corresponding Chinese Patent Application No. 201580038638.7 dated Nov. 1, 2017 with English translation.
Notification of Reasons for Refusal issued in corresponding Japanese Patent Application No. 2017-502658 dated Feb. 6, 2018 with English translation.

* cited by examiner

LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2015/062631, which was filed on Jun. 8, 2015, which claims the benefit of priority of European patent application no. 14177236.8, which was filed on Jul. 16, 2014, and which is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers. In steppers each target portion is irradiated by exposing an entire pattern onto the target portion at one time. Another known lithographic apparatus include so-called scanners. In scanners each target portion is irradiated by scanning the pattern through a projection radiation beam in a given direction (the "scanning"-direction) while synchronously scanning the substrate parallel or anti-parallel to this given direction. It is also possible to transfer the pattern from the patterning device to the substrate by imprinting the pattern onto the substrate.

A lithographic apparatus makes measurements before starting and/or during transfer of the pattern onto the substrate. An example measurement is the position of the substrate relative to a reference frame or a projection system through which the pattern is projected. Measurements can be made using a measurement radiation beam.

The rate at which the lithographic apparatus applies the desired pattern on the substrate, known as throughput, is a major performance criteria in lithography apparatus. A faster throughput is desirable. Throughput is dependent on multiple factors. One factor on which throughput is dependent is the speed at which transfer of the pattern onto the substrate takes place. Another factor on which throughput is dependent is the speed at which measurements needed prior to transfer of the pattern can be taken. Therefore, it is beneficial to have high moving speeds of the substrate during transfer of the pattern onto the substrate and during measurement. However, it is important to maintain accuracy of measurements and transfer of the pattern at the high moving speeds.

Measurement radiation beams in the lithographic apparatus pass through gas, referred to as ambient gas. Local fluctuations in the characteristics of an ambient gas can affect a measurement radiation beam passing through it. Projection radiation beams can be affected in the same way as measurement radiation beams. Therefore, it is an aim of the present invention to provide an apparatus with reduced fluctuations in the characteristics of an ambient gas at a location through which a measurement radiation beam and/or a projection radiation beam passes.

SUMMARY OF THE INVENTION

According to an aspect of the invention, there is provided a lithographic apparatus comprising: a projection system with an optical axis; an enclosure with an ambient gas; and a physical component accommodated in the enclosure, wherein: the lithographic apparatus is configured to cause the physical component to undergo movement relative to the enclosure, in a predetermined direction and in a plane perpendicular to the optical axis; the lithographic apparatus is configured to let the physical component maintain a predetermined orientation with respect to the enclosure during the movement; the movement induces a flow of the ambient gas relative to the component; the physical component has a first surface oriented perpendicularly to the optical axis; the component comprises a flow direction system configured to direct the flow of ambient gas away from the first surface.

According to an aspect of the invention, there is provided a method in a lithographic process comprising: moving a physical component with a first surface relative to an enclosure with an ambient gas, thereby inducing a flow of the ambient gas relative to the physical component; and directing the flow of ambient gas away from the first surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
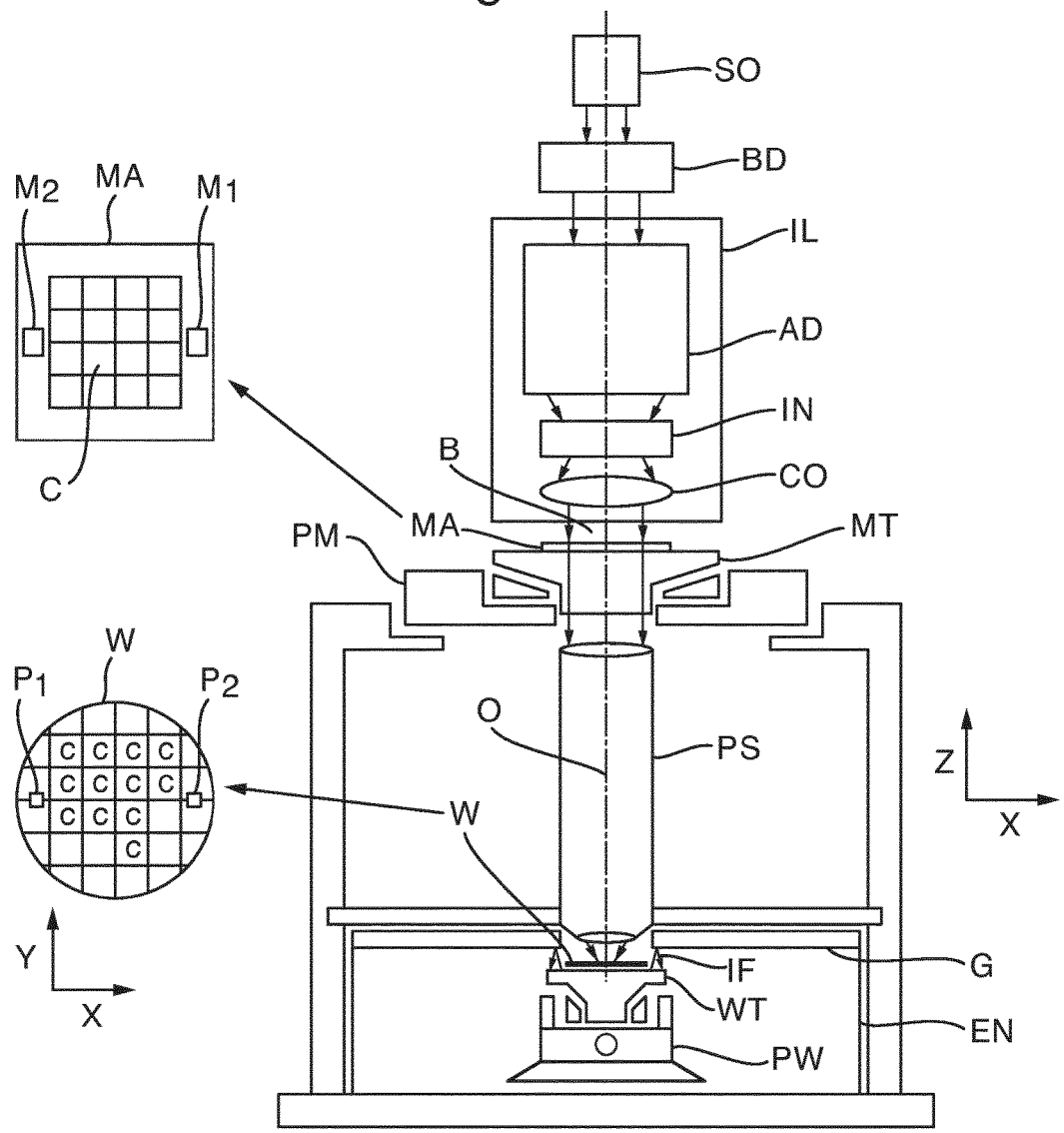
FIG. 1 depicts a lithographic apparatus according to an embodiment of the present invention.

FIG. 1 schematically depicts a lithographic apparatus according to one embodiment of the invention. The apparatus comprises:

an illumination system (illuminator) IL configured to condition a radiation beam B (e.g. UV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the projection radiation beam B by patterning device MA onto a target portion C (e.g. comprising one or more dies) of the substrate W.

The lithographic apparatus comprises an enclosure EN. The enclosure EN encloses at least the substrate table WT. An ambient gas is present in the enclosure EN.

The illumination system IL may include various types of optical components, such as refractive components, reflective components, magnetic components, electromagnetic components, electrostatic components or other types of optical components, or any combination thereof, for directing radiation, shaping radiation, or controlling radiation.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a projection radiation beam with a pattern in its cross-section such as to create a pattern in a target portion C of the substrate W. It should be noted that the pattern imparted to the projection radiation beam may not exactly correspond to the desired pattern in the target portion C of the substrate W, for example if the pattern includes phase-shifting features or so called assist features. Generally, the pattern imparted to the projection radiation beam will correspond to a particular functional layer in a device being created in the target portion C, such as an integrated circuit.

The lithographic apparatus may be of a type having two (dual stage) or more substrate tables WT (and/or two or more mask tables MT). In such "multiple stage" machines the additional substrate table(s) WT and/or mask table(s) MT may be used in parallel. Alternatively preparatory steps may be carried out on one or more substrate table(s) WT and/or mask table(s) MT while one or more other substrate table(s) WT and/or mask table(s) MT are being used for transfer of the pattern onto the substrate W.

The lithographic apparatus may also be of a type wherein at least a portion of the substrate W may be covered by an immersion liquid having a relatively high refractive index, e.g. water, so as to fill a space between the projection system PS and the substrate W. Immersion techniques are well known in the art for increasing the numerical aperture of projection system PS. The term "immersion" as used herein does not mean that a structure, such as a substrate, must be submerged in immersion liquid, but rather only means that immersion liquid is located between the projection system PS and the substrate W during transfer of the pattern onto the substrate.

The projection radiation beam B is incident on the patterning device (e.g., mask MA), which is held on the support structure (e.g., mask table MT), and is patterned by the patterning device. Having traversed the mask MA, the projection radiation beam B passes through the projection system PS, which focuses the projection radiation beam onto a target portion C of the substrate W. With the aid of the second positioner PW and position sensor IF (e.g. an interferometric device, linear encoder with grid G as illustrated in FIG. 1 or capacitive sensor), the substrate table WT can be moved accurately, e.g. so as to position different target portions C in the path of the projection radiation beam B. Similarly, the first positioner PM and another position sensor (which is not explicitly depicted in FIG. 1) can be used to accurately position the mask MA with respect to the path of the projection radiation beam B, e.g. after mechanical retrieval from a mask library, or during a scan in a scanner. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks P1, P2 as illustrated occupy dedicated target portions C, they may be located in spaces between target portions C (these are known as scribe-lane alignment marks). Similarly, in situations in which more than one die is provided on the mask MA, the mask alignment marks P1, P2 may be located between the dies.

The depicted lithographic apparatus could be used in a scanning mode, i.e. as a scanner. In the scanning mode, the mask table MT and the substrate table WT are scanned synchronously while a pattern imparted to the projection radiation beam B is projected onto a target portion C (i.e. a single dynamic exposure). The velocity and direction of the substrate table WT relative to the mask table MT may be determined by the (de-)magnification and image reversal characteristics of the projection system PS.

In the scanning mode, the substrate table WT can move along in a meander path or move back and forwards in the scanning direction SC. Scanning can occur when the substrate table WT is moving forward or backwards along the scanning direction SC. Both directions of movement are equivalent. Purely for ease of description, one direction is referred to as the forward scanning direction and the other as the backward scanning direction.

The substrate table WT (and/or the mask table MT) may be moved in a stepping direction ST to expose a different target portion C of the substrate W. The stepping direction ST is substantially perpendicular to the scanning direction SC. The scanning direction SC and the stepping direction ST can be referred to as the X and Y directions respectively, and vice versa.

A lithographic apparatus uses measurement radiation beams. Measurement radiation beams are used to measure the position, or properties of, different components of the lithographic apparatus. A lithographic apparatus uses a projection radiation beam B to image the substrate W. The projection radiation beam B and measurement radiation beam are affected by ambient gases through which the respective projection radiation beam B and measurement radiation beam pass.

Several factors can affect how a measurement radiation beam propagates through a gas. For example, temperature of the gas, humidity of the gas and composition of the gas are factors which may affect the refractive index of a gas. Localised variations of these factors and turbulence in the gas can result in non-uniformities in the refractive index of the gas. A measurement radiation beam passing through a gas is affected by variations in the refractive index. For example, a change in the refractive index can alter the trajectory of the measurement radiation beam. Additionally or alternatively a change in the refractive index can introduce wavefront errors into the measurement radiation beam. Measurement errors can be induced by variations in the refractive index along a path of a measurement radiation beam. Measurement errors can lead to positioning inaccuracies in the positioning of components of the lithograph apparatus. Any such positioning inaccuracies can alter the placement of the patterned radiation beam PB on the substrate W and so can have a detrimental effect on overlay.

Known arrangements are in place to try to reduce the fluctuations in the refractive index of an ambient gas through which a measurement radiation beam passes. For an example, in an embodiment a barrier system is provided. The barrier system is configured to provide a barrier operative to reduce an inflow of ambient gas into a protected volume between a first surface and a second surface. Measurement radiation beams can pass through the protected volume between the first surface and the second surface. Therefore, gas in the protected volume through which a measurement radiation beam passes can be controlled.

A known barrier system includes a gas curtain which is provided by ejecting barrier gas from openings in the first surface. The gas curtain forms a barrier which impedes the flow of ambient gas on one side of the gas curtain. A gas curtain can be provided around a protected volume such that the gas within the protected volume is effectively separated from the ambient gas outside the protected volume. The gas within the protected volume can be conditioned such that it is more uniform than the gas outside of the protected volume. Therefore, the gas curtain can be used to provide a barrier around a protected volume through which a measurement radiation beams passes. This protects the measurement radiation beam from the effects of changes in ambient gas outside the protected volume. The gas within the protected volume is referred to as the protected gas.

Any unconditioned ambient gas which enters into the protected volume can affect the propagation of the measurement radiation beam and induce errors. Various different ways of preventing ambient gas from entering the protected volume using gas curtains are possible. The different ways include, but are not limited to (i) providing a jet of gas through a single set of openings in the first surface and (ii) providing a turbulent flow of gas through a first set of openings in the first surface surrounding the protected volume radially inwardly with respect to the protected volume of a laminar flow of thermally conditioned gas provided through a second et of openings in the surface.

However, wind tunnel tests on a known barrier system have shown that as moving speed increases, more and more unconditioned ambient gas enters into the protected volume and contaminates the protected gas.

In an embodiment, a lithographic apparatus is provided comprising a physical component which is accommodated in the enclosure EN. The lithographic apparatus is configured to cause the physical component to undergo movement relative to the enclosure EN, in a predetermined direction and in a plane perpendicular to an optical axis O of the projection system PS. In an embodiment the lithographic apparatus is configured to let the physical component maintain a predetermined orientation with respect to the enclosure EN during the movement relative to the enclosure EN. Movement of the first physical component in the enclosure EN induces a flow of the ambient gas in the enclosure EN relative to the physical component. The physical component has a first surface 1 oriented perpendicularly to the optical axis O.

During relative movement of the physical component (such as a substrate table WT) in the ambient gas of the enclosure EN, the flow of the ambient gas relative to the physical component is induced as follows. Movement of the physical component in the enclosure EN causes the ambient gas to be pushed out of the way of the physical component at a side of the physical component acting as the front side of the physical component during the movement. This pushing away creates an increase in pressure of the ambient gas at the front side of the physical component. The movement also causes a decrease in pressure of the ambient gas at a side of the physical component acting as a back side of the physical component during the movement. The difference in pressure of the ambient gas between the front side of the physical component and the back side of the physical component causes a flow of ambient gas from the front side to the back side of the physical component.

The first surface 1 of the physical component has a gas curtain associated with it (e.g. the first surface 1 has openings in it for gas to exit to form a gas curtain or a gas curtain impinges on the first surface 1). Any flow of ambient gas over the first surface 1 of the physical component imposes an inwards force on the gas curtain. The inwards force on the gas curtain increases with increased velocity of the flow of ambient gas. The velocity of the flow of ambient gas increases with increasing velocity of the physical component relative to the enclosure EN. As the inwards force increases, ambient gas from outside the protected volume is forced into the protected volume. Gas entering into the protected volume in this way can be referred to as break-through.

At high moving speeds, break-through of thermally unconditioned ambient gas into the protected volume can be significant. For the case that the physical component is a substrate table WT, this problem is more prominent in the scanning direction SC than in the stepping direction ST. This is because the speed of movement in the scanning direction SC tends to be greater than the speed of movement in the stepping direction ST. For example, the speed of movement in the scanning direction SC is approximately 2 m/s and the speed of movement in the stepping direction ST is approximately 0.8 m/s.

The present invention aims to reduce break-through. The present invention is based on the insight that a high velocity of the flow of ambient gas over the first surface 1 associated with a gas curtain is undesirable. To address this, a flow direction system is provided. The flow direction system is configured to direct the flow of ambient gas away from the first surface 1 associated with a gas curtain. The invention is described below with reference to a system in which the first surface 1 away from which the flow direction system is configured to direct the flow of ambient gas is a surface associated with a gas curtain and the physical component is a substrate table WT. However, the invention is not limited to such a system and can be applied to other systems where a flow of ambient gas over a surface of a physical component moveable in an enclosure with an ambient gas can be induced. The following description will focus on measurement radiation beams. However, the principles apply equally to projection radiation beams. For example, movement of the mask table MT can induce a flow of ambient gas over a surface of the mask MA. A flow of ambient gas over the surface of the mask MA can lead to variations in refractive index. The projection radiation beam passing through the gas affected by variations in refractive index can lead to changes in the projection radiation beam. Changes in the projection radiation beam can lead to imaging errors. So the principles described below in relation to reducing gas flow over the first surface 1 can be used elsewhere in a lithographic apparatus, such as on a mask table MT.

In an embodiment, the physical component comprises a substrate table WT. In an embodiment a further physical component comprises the grid G. Grid G is mounted in a known relative position to the projection system PS. The physical component and the further physical component are configured to undergo relative movement with respect to one another. The relative movement between the physical component and the further physical component is in at least one of the scanning direction SC and the stepping direction ST within the enclosure EN. The physical component or the further physical component may remain stationary whilst the other of the physical component and further physical component moves relative to it. The physical component and further physical component may also move relative to each other in directions other than the scanning direction SC and stepping direction ST.

Figure 2:
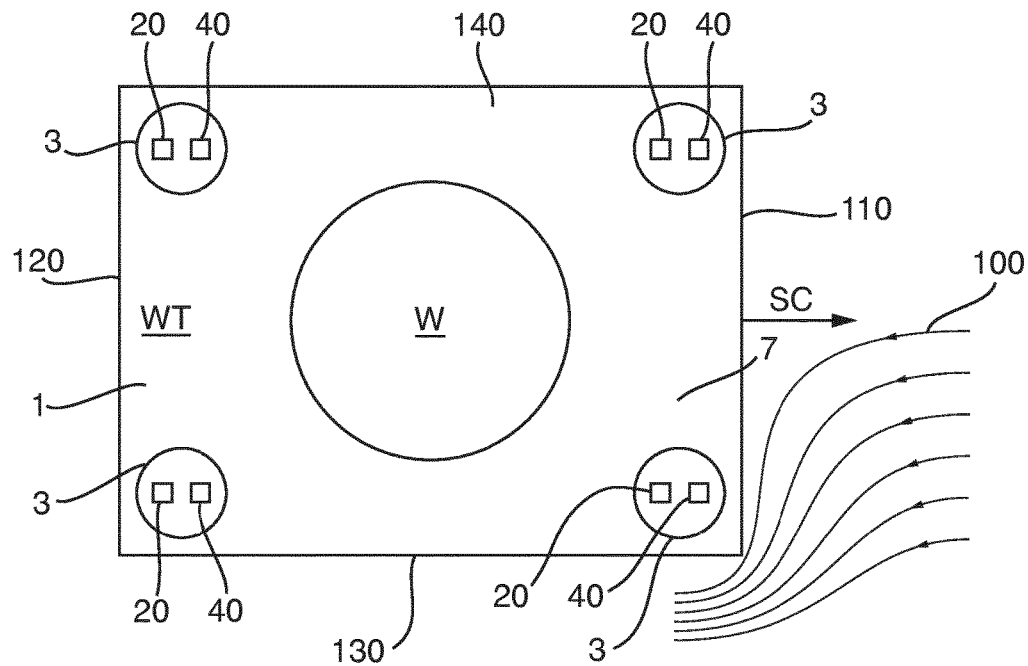
FIG. 2 is a plan view of a substrate table of a lithographic apparatus.
Figure 3:
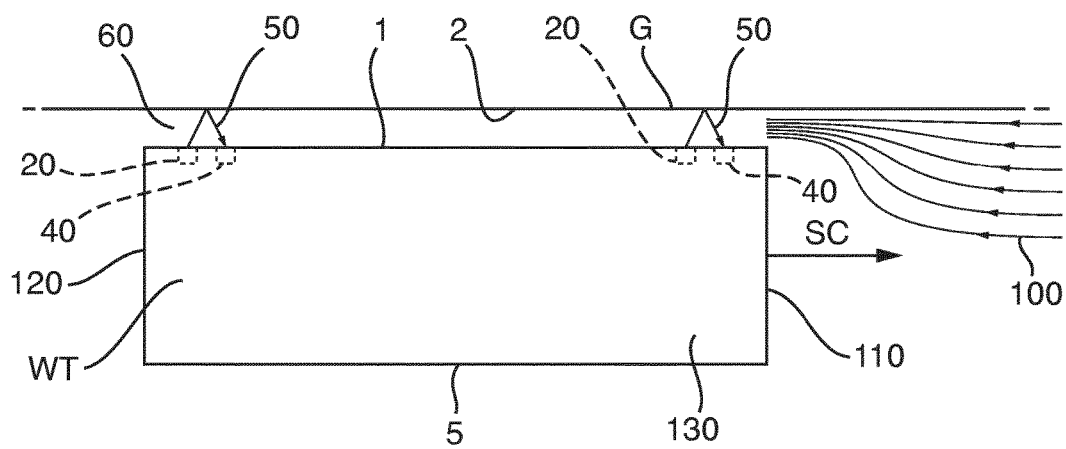
FIG. 3 is a side view of the substrate table of FIG. 2.

FIGS. 2 and 3 illustrate a substrate table WT not in accordance with the present invention. Below the problem addressed by the present invention will be described with reference to FIGS. 2 and 3.

FIG. 2 depicts a schematic plan view of the substrate table WT. The scanning direction SC indicates the relative movement of the substrate table WT with respect to the enclosure EN. FIG. 3 is a schematic side view of the substrate table WT and grid G.

The substrate table WT has a first surface 1 orientated perpendicularly to the optical axis O. The further physical component has a second surface 2 with the grid G thereon. The first surface 1 orientated perpendicularly to the optical axis O and the second surface 2 face each other. The first surface 1 and second surface 2 may face each other such that they are in parallel planes. Both the first surface 1 and second surface 2 may be horizontal (perpendicular to the optical axis O).

In this embodiment, the first surface 1 accommodates at least one barrier system 3. On the substrate table WT of FIG. 2, four barrier systems 3 can be seen. Other objects may be included on the substrate table WT which have not been shown, for example an object configured to hold a substrate W. Each barrier system 3 is configured to provide a barrier operative to reduce an inflow of ambient gas into a protected volume between the first surface 1 and the second surface 2. Each of the barrier systems 3 shown comprises at least one opening in the first surface 1. The at least one opening in the first surface 1 is adapted for a flow of barrier gas therefrom for establishing a gas curtain enclosing part of the protected volume adjacent the first surface 1.

The embodiment further comprises a radiation source 20 for emitting a measurement radiation beam 50, and a sensor 40 for detecting the measurement radiation beam 50. The measurement radiation beam 50 is projected towards the grid G. The measurement radiation beam 50 is reflected and/or refracted by the grid G back to the sensor 40. The measurement radiation beam 50 passes through the protected volume. The sensor 40 configured to detect the measurement radiation beam 50, is used to indicate the position and/or movement of the grid G relative to the radiation source 20 and/or the sensor 40. The sensor 40 measures displacements of the substrate table WT relative to the grid G. Therefore, the position of the substrate WT relative to the projection system PS can be determined. This is possible because the position of the grid G relative to the projection system PS is fixed and known.

In this embodiment, the further physical component comprises a grid G on the second surface 2. The grid G may be directly on the further physical component. Alternatively, the further physical component 2 is a grid plate, wherein the surface of the grid G is the second surface 2. The position of the grid G is known relative to other parts, such as the projection system PS, within the lithographic apparatus.

The radiation source 20 and sensor 40 are most conveniently positioned at corners of the substrate table WT. This is due to the center of the substrate table WT being taken up by the substrate W.

In an embodiment the first surface 1 is an upper surface of the substrate table WT. The substrate table WT has a thickness in the direction of the optical axis O. As can be seen from FIG. 3, the thickness of the substrate table WT is very large compared to a gap 60 between the grid G and the substrate table WT. A bottom surface 5 of the substrate table WT is substantially parallel to the first surface 1. This bottom surface 5 can be a bearing surface. During movement of the substrate table WT (for instance in the scanning direction SC), an edge surface of the substrate table WT acts as a front side 110 of the substrate table WT. The front side 110 extends between the first surface 1 and the bottom surface 5. Another edge surface of the substrate table WT acts as a back side 120 of the substrate table WT during the movement in the scanning direction SC. The back side 120 extends between the first surface 1 and the bottom surface 5. The remaining two edge surfaces of the substrate table WT act as side surfaces 130, 140 of the substrate table WT. The side surfaces 130, 140 extend between the first surface 1 and the bottom surface 5. The side surfaces 130, 140 are neither the front nor the back of the substrate table WT during the movement.

The arrows 100 illustrated in FIGS. 2 and 3 are representative of the flow of ambient gas induced during movement of the substrate table WT in the scanning direction SC (to the right in FIGS. 2 and 3) relative to the enclosure EN. As can be seen, the flow of ambient gas 100 is concentrated at corners, in plan, of the substrate table WT (FIG. 2). The flow of ambient gas 100 is also concentrated over the first surface 1 (FIG. 3). The concentration of the flow of ambient gas 100 over the first surface 1 at the corners, in plan, of the substrate table WT is particularly deleterious because this is also the location of the radiation source 20 and sensor 40 for detecting the measurement radiation beam 50.

The present invention addresses the concentration of the flow of ambient gas 100 over the first surface 1. The invention does this by providing a flow direction system configured to direct the flow of ambient gas 100 away from the first surface 1. For a given speed of movement of the substrate table WT, the velocity of the flow of ambient gas 100 over the first surface 1 is reduced compared to the case where no flow direction system is provided. It is expected that break-through of the ambient gas outside the gas barrier 3 into the protected volume only occurs at a higher scanning speed than without the flow direction system. As a result, a higher scanning speed is possible whilst maintaining accuracy of measurements of the position of the substrate table WT relative to the grid G. In an embodiment, the flow direction system is accommodated on the front side 110.

FIGS. 4-10 illustrate various views of different embodiments of the flow direction system of the present invention, which is absent in FIGS. 2 and 3.

In an embodiment the flow direction system increases resistance to gas flowing over the first surface 1 compared to other possible flow paths for the flow of ambient gas from the front side 110 to the back side 120 of the substrate table WT. In an embodiment the flow direction system additionally or alternatively reduces the resistance to gas flowing around the corners, in plan, of the substrate table WT and/or over the bottom surface 5, compared to over the first surface 1.

Figure 4:
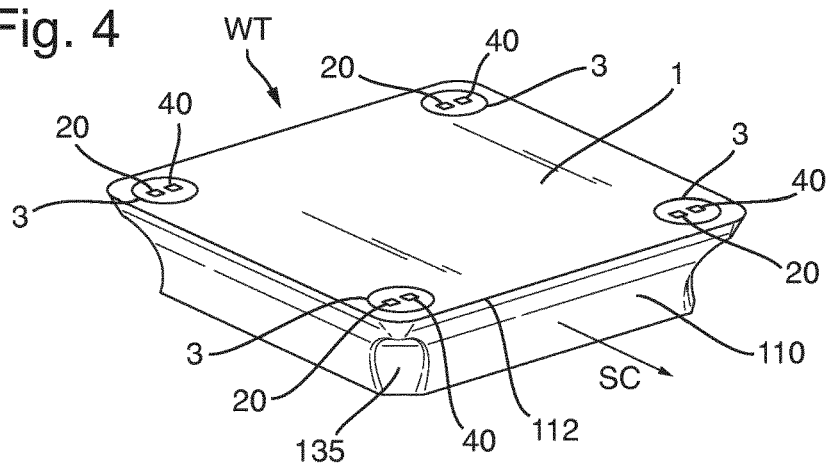
FIGS. 4 and 5 are perspective views of a substrate table according to an embodiment of the present invention.

In an embodiment such as illustrated in FIG. 4, the flow direction system comprises a shaping of the front side 110 of the substrate table WT which acts as the front of the substrate table WT during movement.

In an embodiment the shaping is effective to push the flow of ambient gas 100 away from the first surface 1. In an embodiment the resistance to the flow of gas going over the first surface 1 is increased. Alternatively or additionally the resistance to gas going around the side surfaces 130, 140 is decreased. Alternatively or additionally the resistance to gas going across the bottom surface 5 underneath the substrate table WT is decreased. Alternatively or additionally the resistance to gas going through the substrate table WT (for example through the through holes described below) is decreased.

In an embodiment a protrusion 112 on the front side 110 at a position closer to the first surface 1 than bottom surface 5 increases resistance to gas flowing over the first surface 1 compared to if the protrusion 112 is not present.

The embodiment of FIG. 4 includes recesses 135 in the front side 110 at the corners, in plan, of the substrate table WT. The recesses 135 provide a low resistance escape path for the flow of ambient gas 100 around the corners along the side surfaces 130, 140 of the substrate table WT. The flow of ambient gas 100 takes the low resistance path in preference to a path along the first surface 1.

Figure 11:
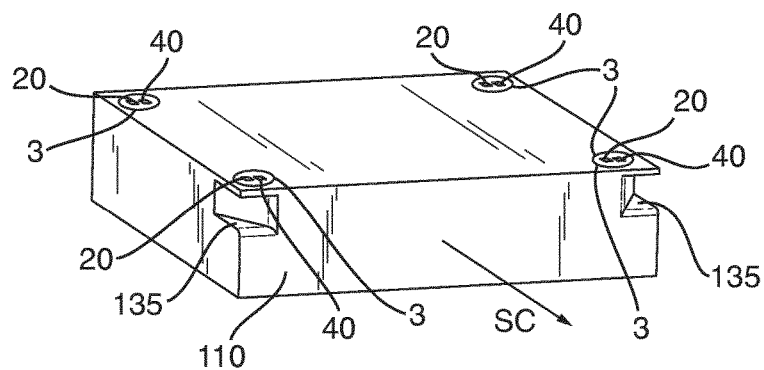
FIG. 11 is a perspective view of a substrate table according to an embodiment of the present invention.
Figure 12:
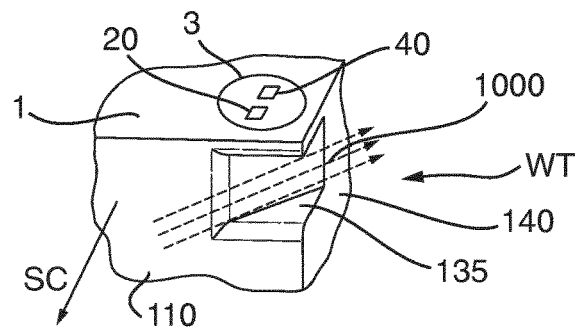
FIG. 12 is a perspective view of a part of the substrate table of FIG. 11.
Figure 13:
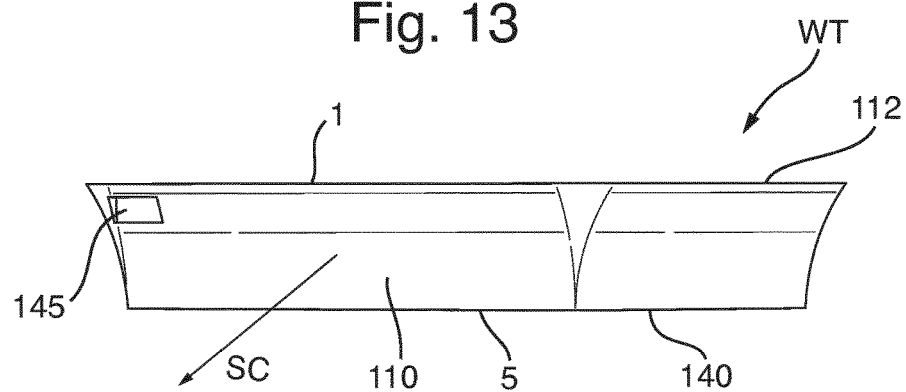
FIG. 13 is a perspective view of a substrate table according to an embodiment of the present invention.
Figure 14:
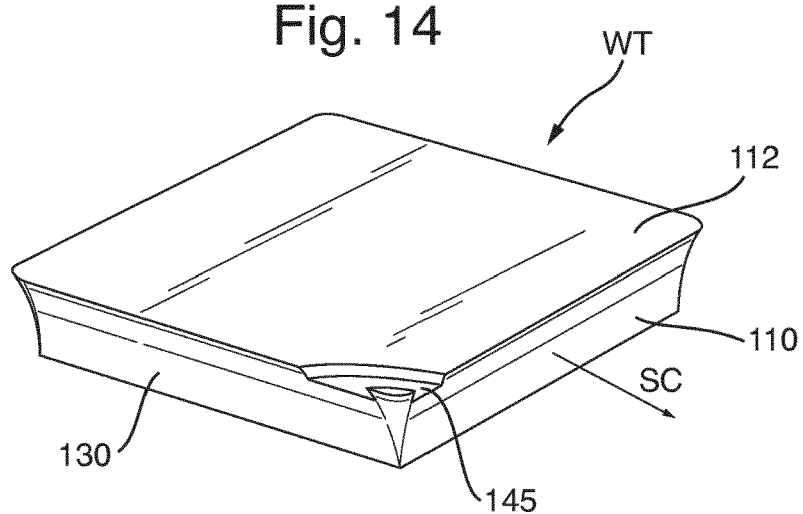
FIG. 14 is a cross-sectional view in the horizontal plane of the substrate table of FIG. 13.

The embodiment of FIGS. 13 and 14 provides a through hole 145 for the same purpose as the recesses 135 of FIGS. 4, 5 and 10-12. That is, the through hole 145 provides a flow path from areas of high pressure of ambient gas at the front side 110 of the substrate table WT to areas of lower pressure at the side surfaces 130, 140 of the substrate table WT. The flow path through the through holes 145 has a lower resistance to flow from the areas of high pressure of ambient gas at the front side 110 of the substrate table WT to areas of low pressure at the back side 120 of the substrate table WT compared to the flow path over the first surface 1.

In the embodiments of FIGS. 4, 5 and 10-14, each of the front side 110, back side 120 and side surfaces 130, 140 of the substrate table WT comprises a flow direction system (e.g. comprise a shaping). However, this is not necessarily the case and only one of the front side 110, back side 120 and side surfaces 130, 140 may comprise a flow direction system. In an embodiment the front side 110 which acts as the front of the physical component during movement in the scanning direction SC (in which movement is fastest) comprises the flow direction system. This is because movement in the scanning direction SC is generally faster and/or occurs more often than in the stepping direction ST.

In an embodiment the front side 110 and back side 120 of the substrate table WT may both comprise a flow direction system. This is because movement in the scanning direction SC may be in the positive direction as well as in the negative direction. Therefore, the front side 110 will become the trailing (back) side when the direction of movement in the scanning direction SC is reversed. Conversely, when the direction of movement in the scanning direction SC is reversed, the back side 120 as illustrated in FIGS. 2 and 3 is likely to become the leading (front) side.

As illustrated in FIG. 4, the flow direction system comprises a protrusion 112 in the form of an overhang or lip on the front side 110 of the substrate table WT. That is, the shaping of the front side 110 comprises an angling of the surface defining the front side 110. The angling is relative to a direction perpendicular to the plane of the first surface 1 (i.e. a direction parallel to the optical axis O). The angling is such that the thickness of the substrate table WT in the direction perpendicular to the first surface 1 (i.e. in the direction of the optical axis O) changes. The change in thickness is a decrease. The decrease in thickness is in a direction approaching a position at which the first surface 1 meets the front side 110. As a result, during movement of the substrate table WT in the scanning direction SC, the pressure of ambient gas at the front side 110 at a position closest to the first surface 1 builds up. This forces the flow of ambient gas away from the area of high pressure towards areas of lower pressure. Areas of lower pressure at the front side 110 are at a position furthest from the first surface 1 and/or at a position distal from a central portion of the front side 110 closer to the side surfaces 130, 140 (i.e. at corners of the substrate table WT, in plan). As a result, the shaping can reduce the amount of flow of ambient gas over the first surface 1. Instead the flow of ambient gas around the side surfaces 130, 140 of the substrate table WT or across the bottom surface 5 underneath the substrate table WT is increased.

FIGS. 6-9 illustrate some embodiments of the shaping in which the thickness of the substrate table WT in the direction perpendicular to the first surface 1 decreases. The thickness decreases in a direction approaching a position at which the first surface 1 meets the front side 110.

Figure 6:
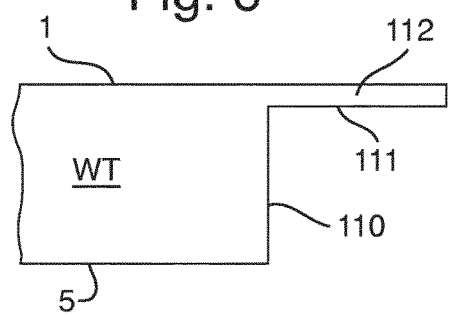
FIGS. 6-9 illustrate, in cross-section, different embodiments of substrate table.

In the embodiment of FIG. 6, there is a step change in thickness. The first surface 1 extends well over the majority of the front side 110. This embodiment can be seen as the protrusion 112 being a lip at the top of the front side 110 (i.e. at a position at which the front side 110 meets the first surface 1). The lip 112 overhangs the majority of the front side 110. An underside 111 of the protrusion 112 is angled at 90° to the direction of the optical axis O.

Figure 7:
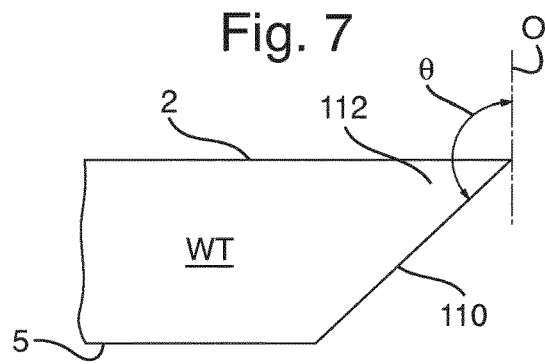

FIG. 7 illustrates a further embodiment in which the surface defining the front side 110 is angled with respect to the direction of the optical axis O. The angling of the front side 110 can be seen as a requirement that the footprint, in plan, of the first surface 1 is greater than that of the bottom surface 5. An angle θ, which is the angle between the optical axis O and the surface of the front side 110 (in which the angle passes through the volume of the substrate table WT), is between 90° and 150°, preferably between 90° and 135°.

Figure 8:
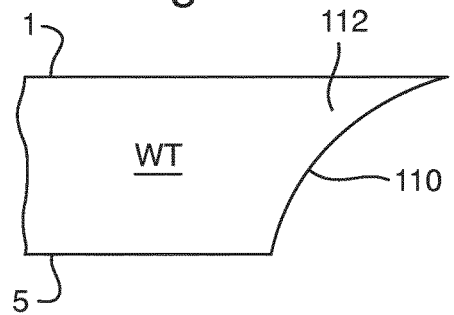

The embodiment of FIG. 8 is similar to that of the embodiment of FIG. 7 except that the surface of the front side 110 is curved and not straight. Any amount of curvature may be present.

Figure 9:
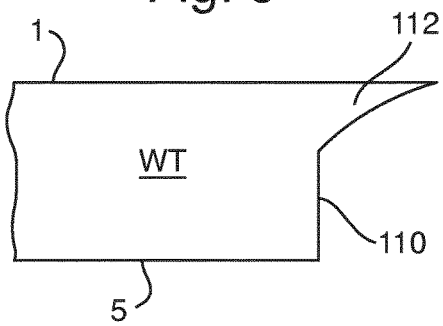

The embodiment of FIG. 9 is similar to that of FIGS. 6 and 7. Part of the surface of the front side 110 is angled relative to the optical axis O (the upper part of the front side 110). The remainder of the front side 110 (the lower portion of the front side 110) is not shaped and is parallel to the direction of the optical axis O.

In the embodiment of FIGS. 4, 5 and 10-14 the recesses 135 are positioned on the front side 110 distal from the first surface 1 (i.e. at a lower position of the front side 110 of the substrate table WT). The recesses 135 are open to an edge of the front side 110. The recesses 135 are open to an edge of the front side 110 which is not an edge of the front side 110 where the front side 110 meets the first surface 1. The edge to which the recesses 135 are open may be an edge between the front side 110 and the bottom surface 5. The edge to which the recesses 135 are open may be an edge between the front side 110 and a side surface 130, 140. In an embodiment the recess 135 is at a corner, in plan, of the substrate table WT. The recess 135 provides an escape path for ambient gas at the front of the substrate table WT during movement in the scanning direction SC. That is, the pressure of gas at the recess 135 is decreased. This encourages ambient gas in front of the substrate table WT during movement in the scanning direction SC to flow through the recess 135. In this way ambient gas flows to the side surfaces 130, 140 of the substrate table WT and thereby around the substrate table WT. As a result, the flow of gas over the first surface 1 is decreased compared to the case where no recess 135 is present.

Although the embodiments of FIGS. 4, 5 and 10-14 illustrate the recess 135 positioned at the corner, in plan, of the substrate table WT, this is not necessarily the case. For example, the recess 135 could be positioned distal from the corner, in plan, of the substrate table WT. For example, the recess 135 could be positioned at a central position of the front side 110 and be open to an edge of the front side 110 with the bottom surface 5 of the substrate table WT. This would encourage flow of gas under the substrate table WT during movement in the scanning direction SC. This reduces the flow of ambient gas over the first surface 1. In an embodiment the recess 135 is present on the side surface 130, 140 or bottom surface 5 as well as in the front side 110.

Figure 5:
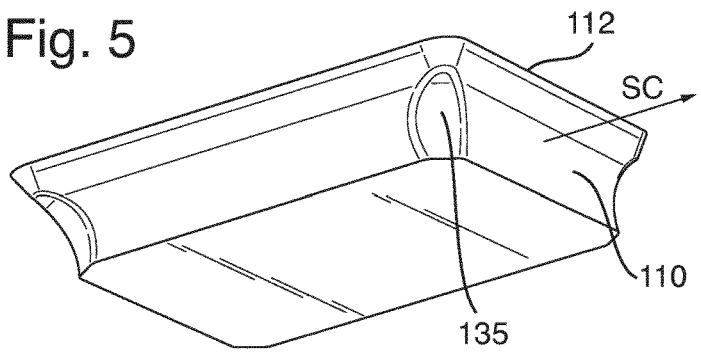
Figure 10:
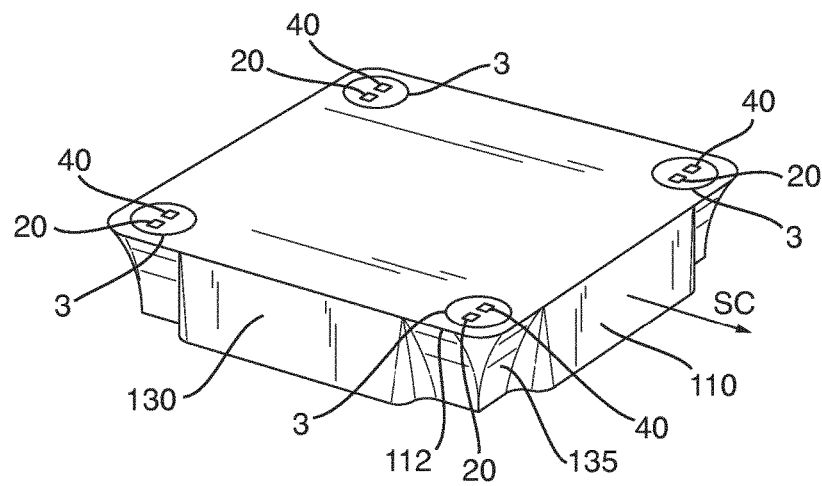
FIG. 10 is a partial perspective view of a substrate table according to an embodiment of the present invention.

The shape of the surfaces defining the recess 135 is not limited. The surface defining the recess 135 may be curved as illustrated in FIGS. 4, 5 and 10. However, the recess 135 may be formed by flat surfaces joined together at a suitable angle.

In the embodiment of FIGS. 4 and 5, the flow direction system is provided along the entire length of the front side 110 of the substrate table WT. In contrast, in the embodiment of FIG. 6, the flow direction system is only provided locally at corners, in plan, of the substrate table WT. This can be seen as the flow direction system being provided at the location where low flow over the first surface 1 is required. The shaping at the corners, in plan, of the substrate table WT in FIG. 6 comprises a protrusion 112. The protrusion 112 can be seen as an angling of the surface defining the front side 110 relative to a direction perpendicular to the first surface 1 direction parallel to the optical axis O decreases. The shaping also comprises a recess 135. A thickness of the substrate table WT in a direction parallel to the optical axis decreases at the corner, in plan, of the substrate table WT. in. The decrease in thickness is in a direction approaching a position at which the first surface 1 meets the front side 110. The compound curve of the front side 110 and side surface 130 at the corner includes features of both a protrusion 112 and a recess 135.

The embodiment of FIGS. 11 and 12 is similar to that of FIG. 6 in that the shaping is provided at corners, in plan, of the substrate table WT. The difference is that the shaping is only provided at a position on the front side 110 closer to the first surface 1 than the bottom surface 5 of the substrate table WT. The shaping of FIGS. 9 and 10 can be seen to comprise a recess 135 as described above. During movement in the scanning direction SC, a low resistance escape flow path 1000 for gas from in front of the substrate table WT exists. The low resistance escape flow path 1000 is from in front of the front side 110, through the recess 135 to the side surface 140 of the substrate table WT.

In the embodiment of FIGS. 13 and 14, a shaping in the form of a protrusion 112 described above with reference to FIGS. 4 and 5 is provided. However, instead of providing a recess, a through hole 145 is provided through the substrate table WT.

The through hole 145 extends through the substrate table WT. The through hole 145 connects areas of high pressure of ambient gas during movement with areas of lower pressure of ambient gas. As a result, gas will flow through the through hole 145.

The through hole 145 can be seen as a low resistance escape path for the flow of gas. Alternatively or additionally the through hole 145 can be seen as a short cut for the flow of gas from an area of high pressure (at the front side 110 of the substrate table WT) to a side surface 130, 140 or the back side 120 of the substrate table WT during movement. The through hole 145 is a flow path with a lower flow resistance than a flow path around the outside of the substrate table WT. The through hole 145 extends between a first through hole opening in a surface of the substrate table WT and a second through hole opening in a surface of the substrate table WT. In an embodiment the first through hole opening is in a surface defining the front side 110 of the substrate table WT. In an embodiment the second through hole opening is in a side surface 130, 140 of the substrate table WT or a surface defining the back side 120 or the bottom surface 5 of the substrate table WT.

As illustrated in FIG. 13, in an embodiment the first through hole opening and second through hole opening are in the front side 110, back side 120 and/or side surfaces 130, 140 at a location closer to the first surface 1 than the bottom surface 5 of the substrate table WT. The build-up of pressure of ambient gas in front of the front side 110 closer to the first surface 1 is reduced in order to direct flow of ambient gas away from the first surface 1.

The invention has been described above in relation to an embodiment in which the radiation source 20, sensor 40 and barrier system 3 are mounted on the substrate table WT and the grid G is stationary relative to the projection system PS. However, the arrangement may be the opposite way round. That is, the radiation source 20, sensor 40 and barrier system 3 may be mounted stationary relative to the projection system PS above the substrate table WT. The first surface 1 of the substrate table WT may then have the grid G thereon. The system may otherwise be the same as described above.

In an embodiment, the physical component is a measurement table (and not a substrate table WT as described above). The further physical component is a grid G at a measurement location (and not at an imaging location as described above). Properties of a substrate W mounted on the measurement table such as position on the measurement table, surface topography of the substrate W, etc. are measured at the measurement location. In this embodiment the grid G may be positioned above the measurement table (similar to the main embodiment described above) or may be positioned on the measurement table as described in the preceding paragraph.

A lithographic apparatus in accordance with at least one of the above embodiments can be used in a device manufacturing method to irradiate a substrate using a projection radiation beam.

In an embodiment, there is provided a lithographic apparatus comprising: a projection system with an optical axis; an enclosure with an ambient gas; and a physical component accommodated in the enclosure, wherein: the lithographic apparatus is configured to cause the physical component to undergo movement relative to the enclosure, in a predetermined direction and in a plane perpendicular to the optical axis; the lithographic apparatus is configured to let the physical component maintain a predetermined orientation with respect to the enclosure during the movement; the movement induces a flow of the ambient gas relative to the component; the physical component has a first surface oriented perpendicularly to the optical axis; the component comprises a flow direction system configured to direct the flow of ambient gas away from the first surface.

In an embodiment, the flow direction system comprises a shaping of a front side of the physical component, the front side acting as the front of the physical component during the movement. In an embodiment, the shaping comprises an angling of the front side relative to a direction perpendicular to the first surface such that a thickness of the physical component in a direction perpendicular to the first surface decreases in a direction approaching a position at which the first surface meets the front side. In an embodiment, the shaping comprises a recess in the front side, the recess being positioned on the front side distal from the first surface and being open to an edge of the front side other than an edge of the front side where the front side meets the first surface. In an embodiment, the shaping of the front side is at least at a corner of the physical component when viewed from above the first surface. In an embodiment, the flow direction system comprises a through hole extending through the first component between a first opening and a second opening thereby to provide a through hole flow path for gas from in front of the physical component to the side or back of the physical component during the movement, the through hole flow path having a lower flow resistance than an outer flow path for gas around an outside of the physical component from the first opening to the second opening.

In an embodiment, there is provided a method in a lithographic process comprising: moving a physical component with a first surface relative to an enclosure with an ambient gas, thereby inducing a flow of the ambient gas relative to the physical component; and directing the flow of ambient gas away from the first surface.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
a projection system with an optical axis;
an enclosure; and
a physical component, accommodated in the enclosure, configured to undergo movement relative to the enclosure in a predetermined direction and in a plane perpendicular to the optical axis,
wherein the movement induces a flow of ambient gas relative to the physical component,
wherein the physical component comprises a flow direction system configured to direct the flow of ambient gas away from a surface of the physical component, the surface oriented perpendicularly to the optical axis and there being a measurement system component at the surface, and
wherein the flow direction system comprises a shaping of a front side of the physical component, the front side acting as the front of the physical component during the movement and the shaping comprises an angling of the front side relative to a direction perpendicular to the surface such that a thickness of the physical component in a direction perpendicular to the surface decreases in a direction approaching a position at which the surface meets the front side.

2. The lithographic apparatus of claim 1, wherein the shaping comprises a recess in the front side, the recess being positioned on the front side distal from the surface and being open to an edge of the front side other than an edge of the front side where the front side meets the surface.

3. The lithographic apparatus of claim 1, wherein the shaping of the front side is at least at a corner of the physical component when viewed from above the surface.

4. The lithographic apparatus of claim 1, wherein the flow direction system comprises a through hole extending through the physical component between a first opening and a second opening thereby to provide a through hole flow path for gas from in front of the physical component to the side or back of the physical component during the movement, the through hole flow path having a lower flow resistance than an outer flow path for gas around an outside of the physical component from the first opening to the second opening.

5. The lithographic apparatus of claim 1, wherein the physical component comprises a protrusion and the angling is at least partly below the top of the protrusion.

6. The lithographic apparatus of claim 1, wherein the angling of the front side comprises a curved portion below the surface.

7. The lithographic apparatus of claim 1, wherein the physical component is a substrate table configured to hold a substrate.

8. A method in a lithographic process, the method comprising:
   moving a physical component with a surface relative to an enclosure with an ambient gas, thereby inducing a flow of the ambient gas relative to the physical component; and
   directing the flow of ambient gas away from the surface by using a shaping of a front side of the physical component, the front side acting as the front of the physical component during the movement,
   wherein the shaping comprises an angling of the front side relative to a direction perpendicular to the surface such that a thickness of the physical component in a direction perpendicular to the surface decreases in a direction approaching a position at which the surface meets the front side and there being a measurement system component at the surface, or
   wherein the shaping comprises a recess in the front side, the recess being positioned on the front side distal from the surface and being open to an edge of the front side other than an edge of the front side where the front side meets the surface.

9. The method of claim 8, wherein the shaping comprises the angling of the front side.

10. The method of claim 9, wherein the angling of the front side comprises a curved portion below the surface.

11. The method of claim 8, wherein the shaping comprises the recess in the front side.

12. The method of claim 11, wherein the recess extends into a side, adjacent the front, of the physical component.

13. The method of claim 8, wherein the shaping of the front side is at least at a corner of the physical component when viewed from above the surface.

14. The method of claim 8, comprising using a through hole extending through the physical component between a first opening and a second opening thereby to provide a through hole flow path for gas from in front of the physical component to the side or back of the physical component during the movement, the through hole flow path having a lower flow resistance than an outer flow path for gas around an outside of the physical component from the first opening to the second opening.

15. A lithographic apparatus comprising:
   a projection system with an optical axis;
   an enclosure with an ambient gas; and
   a physical component, accommodated in the enclosure, configured to undergo movement relative to the enclosure in a predetermined direction and in a plane perpendicular to the optical axis, wherein the movement induces a flow of the ambient gas relative to the physical component and the physical component comprises a surface oriented perpendicularly to the optical axis,
   wherein the physical component comprises a shaping of a front side of the physical component to direct the flow of ambient gas away from the surface, the front side acting as the front of the physical component during the movement and the shaping comprising a recess in the front side, the recess being positioned on the front side distal from the surface and being open to an edge of the front side other than an edge of the front side where the front side meets the surface.

16. The lithographic apparatus of claim 15, wherein the shaping of the front side is at least at a corner of the physical component when viewed from above the surface.

17. The lithographic apparatus of claim 15, wherein the flow direction system comprises a through hole extending through the first component between a first opening and a second opening thereby to provide a through hole flow path for gas from in front of the physical component to the side or back of the physical component during the movement, the through hole flow path having a lower flow resistance than an outer flow path for gas around an outside of the physical component from the first opening to the second opening.

18. The lithographic apparatus of claim 15, wherein the front side comprises an angling, the angling comprising a curved portion below the surface.

19. The lithographic apparatus of claim 15, wherein the recess extends into a side, adjacent the front, of the physical component.

20. The lithographic apparatus of claim 15, wherein the physical component is a substrate table configured to hold a substrate.

* * * * *